(12) United States Patent
Kim

(10) Patent No.: US 8,345,499 B2
(45) Date of Patent: Jan. 1, 2013

(54) SEMICONDUCTOR DEVICE

(75) Inventor: Sung Hoon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/396,092

(22) Filed: Feb. 14, 2012

(65) Prior Publication Data

US 2012/0146119 A1 Jun. 14, 2012

Related U.S. Application Data

(62) Division of application No. 12/320,037, filed on Jan. 15, 2009, now Pat. No. 8,144,538.

(30) Foreign Application Priority Data

Jan. 25, 2008 (KR) .................. 10-2008-0008099

(51) Int. Cl.
*G11C 7/02* (2006.01)
(52) U.S. Cl. .................. 365/210.1; 365/185.2; 365/52; 365/174

(58) Field of Classification Search ............... 365/210.1, 365/185.2, 52, 174
See application file for complete search history.

(56) References Cited

U.S. PATENT DOCUMENTS

| | | | |
|---|---|---|---|
| 2004/0171218 A1 | 9/2004 | Kim et al. | |
| 2005/0116268 A1 | 6/2005 | Tahira et al. | |
| 2008/0219054 A1 | 9/2008 | Arai et al. | |
| 2010/0127234 A1* | 5/2010 | Park .................. | 257/4 |
| 2010/0246255 A1* | 9/2010 | Shiino et al. ........ | 365/185.2 |

FOREIGN PATENT DOCUMENTS

| | | |
|---|---|---|
| JP | 2005-167039 | 6/2005 |
| KR | 10-0207519 | 4/1999 |
| KR | 2000-0043072 | 7/2000 |

* cited by examiner

*Primary Examiner* — Vu Le
*Assistant Examiner* — Han Yang
(74) *Attorney, Agent, or Firm* — Harness, Dickey & Pierce

(57) ABSTRACT

A semiconductor device to improve layout uniformity may include an active region formed in a substrate, a dummy active region formed in the substrate and separated from the active region, a word line crossing over the active region, and a dummy word line. The dummy word line is formed over the dummy active region to overlap at least part of the dummy active region and may have an end positioned within the dummy active region.

10 Claims, 9 Drawing Sheets

SEMICONDUCTOR DEVICE

PRIORITY STATEMENT

This U.S. non-provisional application claims priority under 35 U.S.C. §120/121 to and is a divisional of U.S. application Ser. No. 12/320,037, filed Jan. 15, 2009, now U.S. Pat. No. 8,144,538, which claims priority under 35 U.S.C. §119 to Korean Patent Application No. 10-2008-0008099, filed on Jan. 25, 2008, in the Korean Intellectual Property Office, the entire contents of each these applications is hereby incorporated herein by reference.

BACKGROUND

1. Field

Example embodiments relate to a semiconductor device, and more particularly, to a semiconductor device for improving layout uniformity.

2. Description of the Related Art

When word lines are patterned such that transistors may be arranged with various widths and spaces in a semiconductor device, a difference in processing dimensions of word lines between a sparse pattern area and a dense pattern area occurs due to light proximity effect during exposure or microloading effect during an etching that deteriorates layout uniformity. The difference in the processing dimensions may cause current unbalance and deterioration of characteristics or a defect in a transistor.

SUMMARY

Example embodiments provide a semiconductor device for improving layout uniformity using a dummy pattern.

In one example embodiment, a semiconductor device including an active region formed in a substrate; a dummy active region formed in the substrate and separated from the active region; a word line crossing over the active region; and a dummy word line, formed over the dummy active region to overlap at least part of the dummy active region, having an end positioned within the dummy active region, according to example embodiments.

The semiconductor device may further include a bit line that crosses over the active region and the dummy active region and that may be electrically connected with the dummy active region and the word line.

The active region and the dummy active region may be positioned in a first conductivity type region. The dummy active region and the dummy word line may form a second conductivity type MOS transistor. The dummy active region may be electrically connected with a bit line crossing over the dummy active region. The dummy word line may be electrically connected with a second conductivity type region outside the first conductivity type region. The dummy active region and the dummy word line may form a power capacitor.

In another example embodiment, there is provided a semiconductor device includes an active region formed in a substrate; a dummy active region formed in the substrate and separated from the active region; an active region bridge connecting the active region with the dummy active region; a word line crossing over the active region; and a dummy word line, formed over the dummy active region to overlap at least part of the dummy active region, having an end positioned within the dummy active region.

The semiconductor device may further include a bit line that crosses over the active region, the dummy active region, and the active region bridge and that may be electrically connected to the dummy active region and the word line.

The active region, the active region bridge, and the dummy active region may be positioned in a first conductivity type region. The dummy active region and the dummy word line may form a second conductivity type MOS transistor. The dummy active region may be electrically connected with a bit line crossing over the dummy active region. The dummy word line may be electrically connected with a second conductivity type region outside the first conductivity type region. The dummy active region and the dummy word line may form a power capacitor.

BRIEF DESCRIPTION OF THE DRAWINGS

Example embodiments will be more clearly understood from the following brief description taken in conjunction with the accompanying drawings.

FIG. 1 is a layout of a part of a semiconductor device according to an example embodiment;

FIG. 2 is an equivalent circuit diagram of a dummy region in the semiconductor device illustrated in FIG. 1;

FIG. 3 is a layout of a part of a semiconductor device according to an example embodiment;

FIG. 4 is a layout of a part of a semiconductor device according to an example embodiment;

FIG. 5 is an equivalent circuit diagram of a dummy region in the semiconductor device illustrated in FIG. 4;

FIG. 6 is a layout of a part of a semiconductor device according to an example embodiment;

FIG. 7 is a layout of a part of a semiconductor device according to an example embodiment;

FIG. 8 is an equivalent circuit diagram of a dummy region in the semiconductor device illustrated in FIG. 7; and FIG. 9 is a layout of a part of a semiconductor device according to example embodiments.

Figure 1:
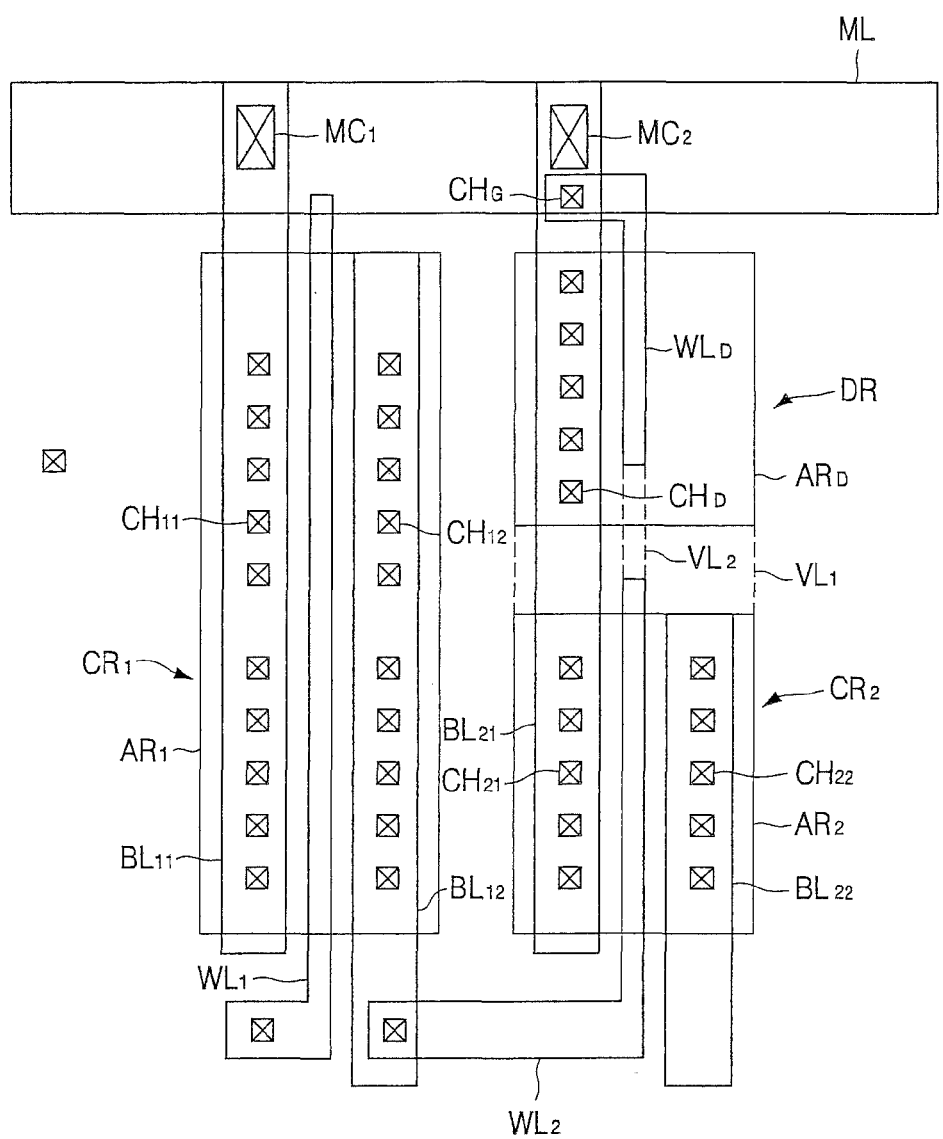
FIGS. 1-9 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the concept of example embodiments to those skilled in the art. The scope of example embodiments will be defined by the claims. Therefore, well-known processes, element structures and technology will not be described in detail in some embodiments in order to avoid ambiguousness. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections, should not be limited by these terms. These terms are only used to distinguish elements, components, regions, layers and/or sections. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
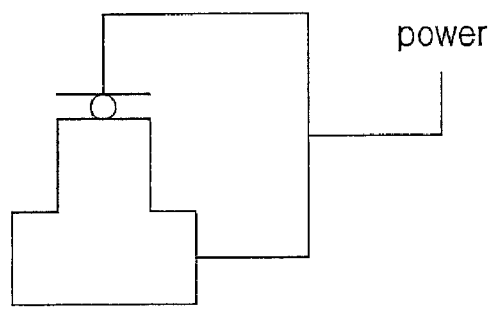

FIG. 1 is a layout of a part of a semiconductor device according to an example embodiment. FIG. 2 is an equivalent circuit diagram of a dummy region DR in the semiconductor device illustrated in FIG. 1. Referring to FIG. 1, the semiconductor device includes cell regions $CR_1$ and $CR_2$ including a typical transistor and the dummy region DR including a dummy transistor.

A dummy region (e.g. dummy active region), as described in example embodiments, is a region within the semiconductor device that is not necessary for the function of the device, but in which non-functioning elements (e.g. dummy word line, dummy transistor, etc.) are nevertheless created due to, for example, process considerations in fabricating the device. For example, dummy regions may be used to reduce removal rate variation that may occur between densely and sparsely packed areas during planarization (e.g. during chemical/mechanical planarization).

The dummy region DR may be positioned in an empty space that the cell regions $CR_1$ and $CR_2$ do not occupy on a semiconductor substrate. In addition, the dummy region DR may be selected and positioned in an empty space. When the dummy region DR is formed throughout the entire empty space, it is not sufficient to prevent or reduce irregularity of processing dimensions. For this reason, the dummy region DR is positioned in the empty space such that it is substantially aligned with the cell regions $CR_1$ and $CR_2$ both in widthwise and lengthwise, thereby improving layout uniformity.

The cell regions $CR_1$ and $CR_2$ include active regions $AR_1$ and $AR_2$ positioned in the semiconductor substrate; word lines $WL_1$ and $WL_2$ crossing the active regions $AR_1$ and $AR_2$; and bit lines $BL_{11}$, $BL_{12}$, $BL_{21}$, $BL_{22}$ transferring electrical signals to source/drain regions (not shown) positioned at the active regions $AR_1$ and $AR_2$ via contacts $CH_{11}$, $CH_{12}$, $CH_{21}$, and $CH_{22}$. The bit lines $BL_{11}$, $BL_{12}$, $BL_{21}$, and $BL_{22}$ may be electrically connected with one another via a metal line ML and metal contacts $MC_1$ and $MC_2$.

The dummy region DR may include a dummy active region $AR_D$ positioned in the semiconductor substrate, a dummy word line $WL_D$ that overlaps at least part of the dummy active region $AR_D$ and may have an end positioned in the dummy active region $AR_D$, and the bit line $BL_{21}$ that the dummy region DR shares with the cell region $CR_2$. Since the end of the dummy word line $WL_D$ may be kept within the dummy active region $AR_D$, the same voltages may be applied to all of source/drain regions (not shown) in the dummy active region $AR_D$, that may be electrically connected with the bit line $BL_{21}$ via a contact $CH_D$ positioned at an overlap between the dummy active region $AR_D$ and the bit line $BL_{21}$. In addition, since the dummy word line $WL_D$ may be electrically connected with the bit line $BL_{21}$ via a contact $CH_G$, the substantially the same voltages may be applied to the dummy active region $AR_D$ and the dummy word line $WL_D$. An equivalent circuit representing this connection is illustrated in FIG. 2.

Accordingly, substantially the same voltages may be applied to the source/drain regions in the dummy active region $AR_D$ and to the dummy word line $WL_D$ by positioning the end of the dummy word line $WL_D$ within the dummy active region $AR_D$, so that the source/drain regions in the dummy active region $AR_D$ and the dummy word line $WL_D$ may be prevented or reduced from floating. As a result, malfunction of the semiconductor device that may occur due to floating may be prevented or reduced.

For layout uniformity of the semiconductor device, the dummy active region $AR_D$ of the dummy region DR may be separated from the active region $AR_1$ by substantially the same distance as the distance between the active regions $AR_1$ and $AR_2$. One end of the dummy active region $AR_D$ may be aligned with one end of the active region $AR_1$. In addition, the dummy active region $AR_D$ may be aligned with a virtual line $VL_1$ extended from an end of the active region $AR_2$. At least part of the dummy word line $WL_D$ of the dummy region DR may be aligned with a virtual line $VL_2$ extending from an end of the word line $WL_2$.

Figure 3:
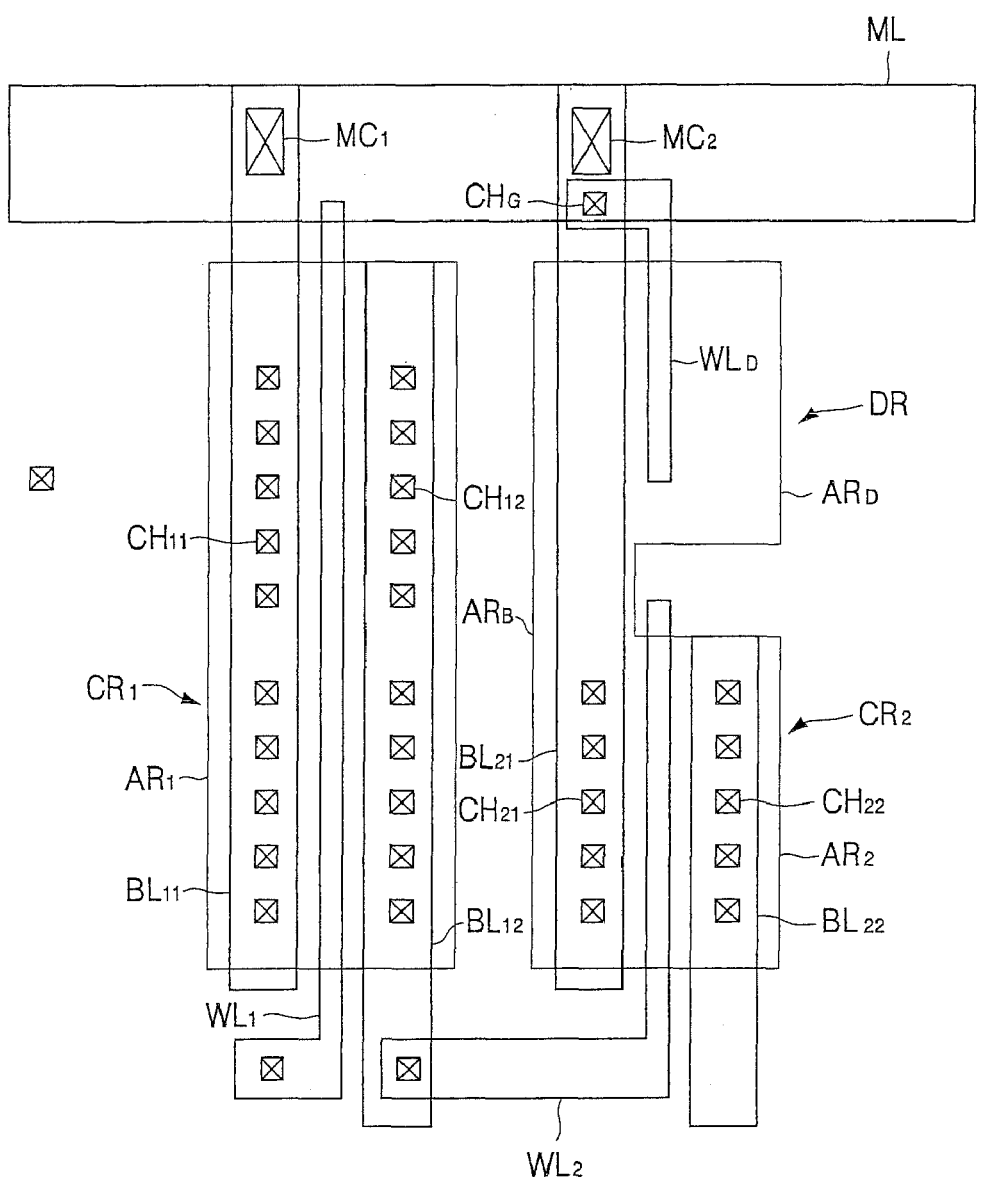

FIG. 3 is a layout of a part of a semiconductor device according to an example embodiment. The semiconductor device is substantially the same as the semiconductor device described in FIG. 1, with the exception that the semiconductor device of the example embodiment may include an active bridge connecting an active region with a dummy active region. Thus, the differences between the two embodiments will be described in detail and redundant descriptions will be omitted.

Referring to FIG. 3, the semiconductor device of this example embodiment may include the cell regions $CR_1$ and $CR_2$ including a typical transistor and the dummy region DR including a dummy transistor.

The active region $AR_2$ in the cell region $CR_2$ may be connected with the dummy active region $AR_D$ in the dummy region DR via an active region bridge $AR_B$. Accordingly, even when it may be difficult to form a contact for electrical connection at an overlap between the dummy active region $AR_D$ and the bit line $BL_{21}$, a voltage substantially the same as a voltage applied to the active region $AR_2$ via the bit line $BL_{21}$ may be applied to the dummy active region $AR_D$ due to the extension of an active region through the active region bridge $AR_B$. In other words, the dummy active region $AR_D$ may be electrically connected with the bit line $BL_{21}$ via the contact $CH_{21}$ positioned at an overlap between the active region $AR_2$ and the bit line $BL_{21}$. As a result, substantially the same voltages may be applied to the dummy active region $AR_D$ and the dummy word line $WL_D$. Therefore, source/drain regions (not shown) in the dummy active region $AR_D$ and the dummy word line $WL_D$ may be prevented or reduced from floating, so that malfunction of the semiconductor device that may occur due to the floating may be prevented or reduced.

Figure 4:
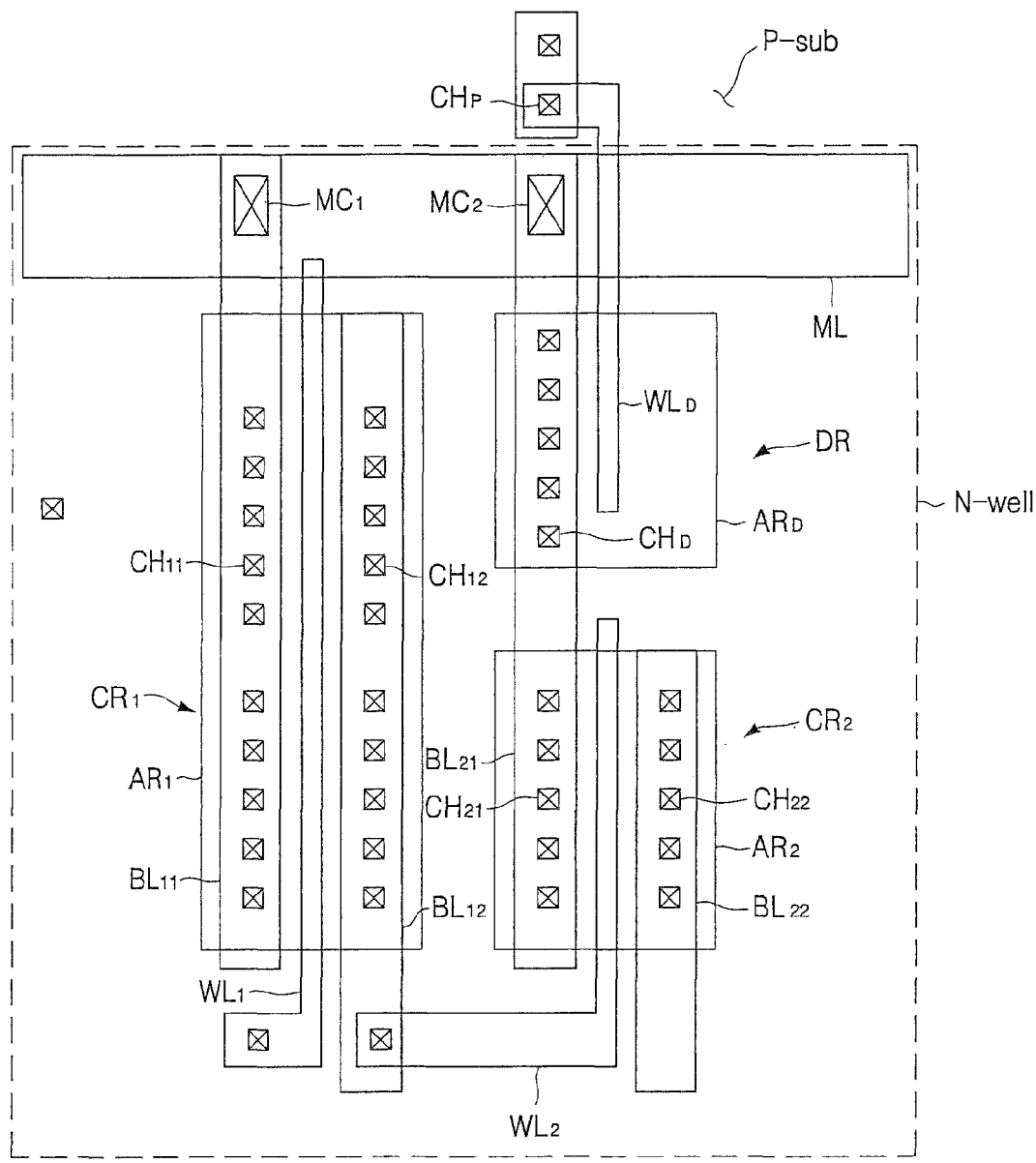

FIG. 4 is a layout of a part of a semiconductor device according to an example embodiment. The semiconductor device is substantially the same as the semiconductor device described in FIG. 1, with the exception that the semiconductor device of the example embodiment may include a power capacitor formed by a dummy active region and a dummy word line. Thus, the differences between the two embodiments will be described in detail and redundant descriptions will be omitted.

Referring to FIG. 4, an N-well may be positioned in the cell regions $CR_1$ and $CR_2$ on a p-substrate. In the N-well are positioned PMOS transistors having the active regions $AR_1$ and $AR_2$ doped with P-type impurity ions. Source/drain regions (not shown) may be defined by the word lines $WL_1$ and $WL_2$ in the active regions $AR_1$ and $AR_2$ doped with the P-type impurity ions.

The N-well may be positioned in the dummy region DR on the p-substrate and may include a PMOS dummy transistor having the dummy active region $AR_D$ doped with P-type impurity ions. An end of the dummy word line $WL_D$ of the PMOS dummy transistor may be positioned within the dummy active region $AR_D$ and its other end may be positioned on the p-substrate outside of the N-well. The other end of the dummy word line $WL_D$ may be electrically connected with the p-substrate via a contact plug $CH_P$. The dummy active region $AR_D$ in source/drain regions (not shown) of the PMOS dummy transistor may be electrically connected with the bit line $BL_{21}$, which may be shared by the dummy active region $AR_D$ and the active region $AR_2$, via the contact $CH_D$.

Figure 5:
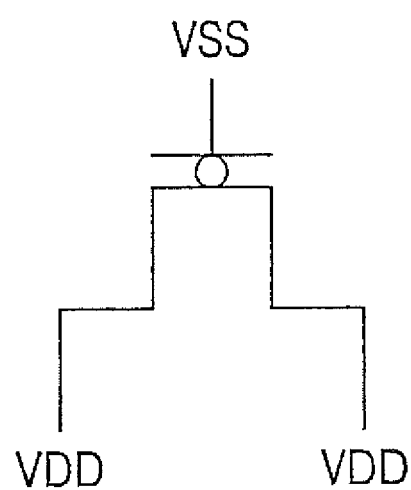

The PMOS dummy transistor may be implemented as a capacitor reducing power supply noise, (e.g., a power capacitor). In detail, when a power supply voltage VDD may be applied to the dummy active region $AR_D$ via the bit line $BL_{21}$ electrically connected with the metal line ML via the contact $MC_2$, the power capacitor may be implemented using the PMOS dummy transistor including source and drain connected in common with the power supply voltage VDD and a dummy gate line connected with a ground voltage VSS of the p-substrate. An equivalent circuit diagram of the power capacitor is illustrated in FIG. 5.

As described above, when a power capacitor is implemented using a transistor in a dummy region, noise that may occur in a power supply line of an integrated circuit may be reduced.

Figure 6:
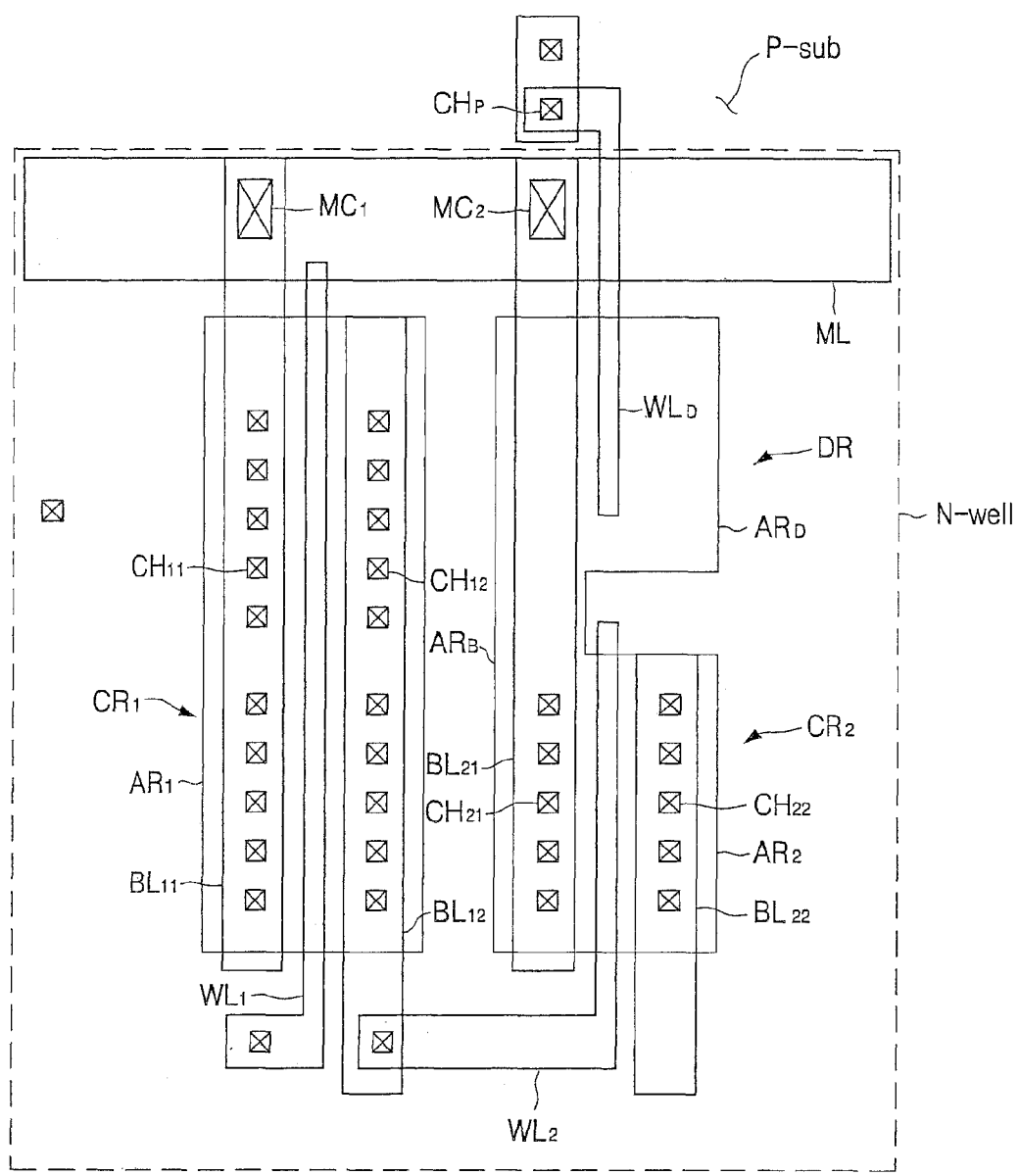

FIG. 6 is a layout of a part of a semiconductor device according to an example embodiment. The semiconductor device is a combination of the embodiment described with respect to FIG. 3 where an active region may be connected with a dummy active region via an active region bridge and the embodiment described with respect to FIG. 4 where the dummy active region and a dummy word line implement a power capacitor using a PMOS dummy transistor. Thus, redundant descriptions are omitted.

Figure 7:
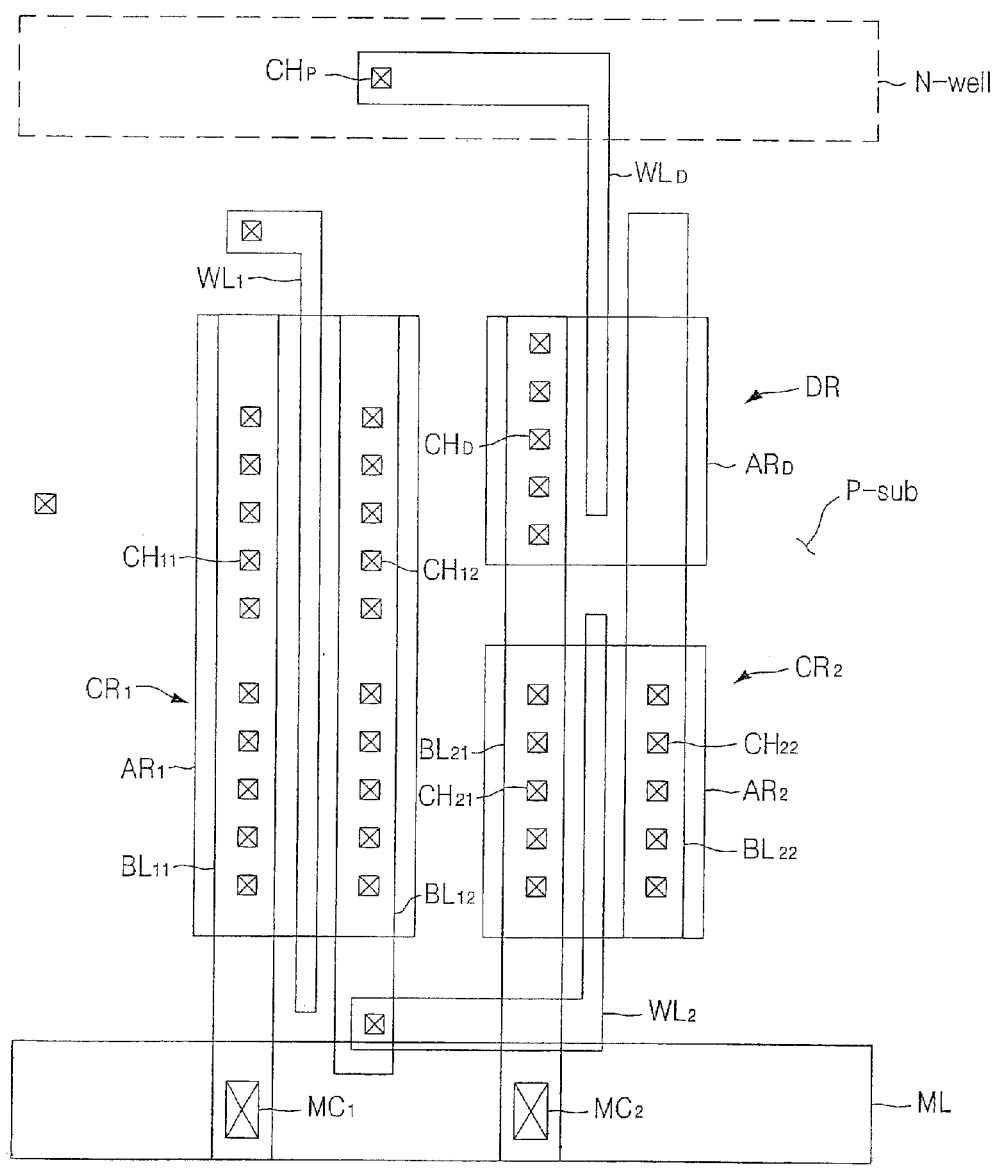

FIG. 7 is a layout of a part of a semiconductor device according to an example embodiment. The semiconductor device is substantially the same as the semiconductor device described in FIG. 6, with the exception that polarity of the region where a dummy active region may be positioned and polarity of the region electrically connected with a dummy word line in the semiconductor of the example embodiment may be opposite to those in the semiconductor device of the example embodiment of FIG. 6. Thus, differences between the two embodiments will be described in detail and redundant descriptions will be omitted.

Referring to FIG. 7, NMOS transistors having the active regions $AR_1$ and $AR_2$ doped with N-type impurity ions on the p-substrate may be positioned in the cell regions $CR_1$ and $CR_2$. Source/drain regions (not shown) may be defined by the word lines $WL_1$ and $WL_2$ in the active regions $AR_1$ and $AR_2$ doped with N-type impurity ions.

The dummy region DR may include an NMOS dummy transistor having the dummy active region $AR_D$ doped with N-type impurity ions on the p-substrate. An end of the dummy word line $WL_D$ of the NMOS dummy transistor may be positioned within the dummy active region $AR_D$ and the other end may be positioned in an adjacent N-well. The other end of the dummy word line $WL_D$ may be electrically connected with the N-well via the contact plug $CH_P$. The dummy active region $AR_D$ where the source/drain regions (not shown) of the NMOS dummy transistor may be positioned, may also be electrically connected to the bit line $BL_{21}$, that may be shared by the dummy active region $AR_D$ and the active region $AR_2$, via the contact $CH_D$.

Figure 8:
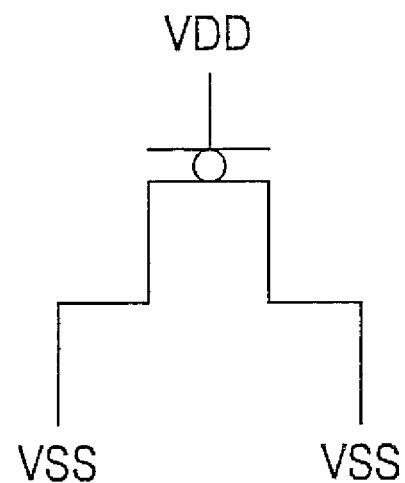

The NMOS dummy transistor may be implemented as a power capacitor that reduces power supply noise. In detail, when the ground voltage VSS is applied to the dummy active region $AR_D$ via the bit line $BL_{21}$ electrically connected with the metal line ML via the contact $MC_2$, the power capacitor may be implemented using the NMOS dummy transistor including source and drain connected in common with the ground voltage VSS and a dummy gate line, i.e., the dummy word line $WL_D$ connected with the power supply voltage VDD of the N-well. An equivalent circuit diagram of the power capacitor is illustrated in FIG. 8.

As described above, when a power capacitor is implemented using a transistor in a dummy region, noise that may occur in a power supply line of an integrated circuit may be reduced.

Figure 9:
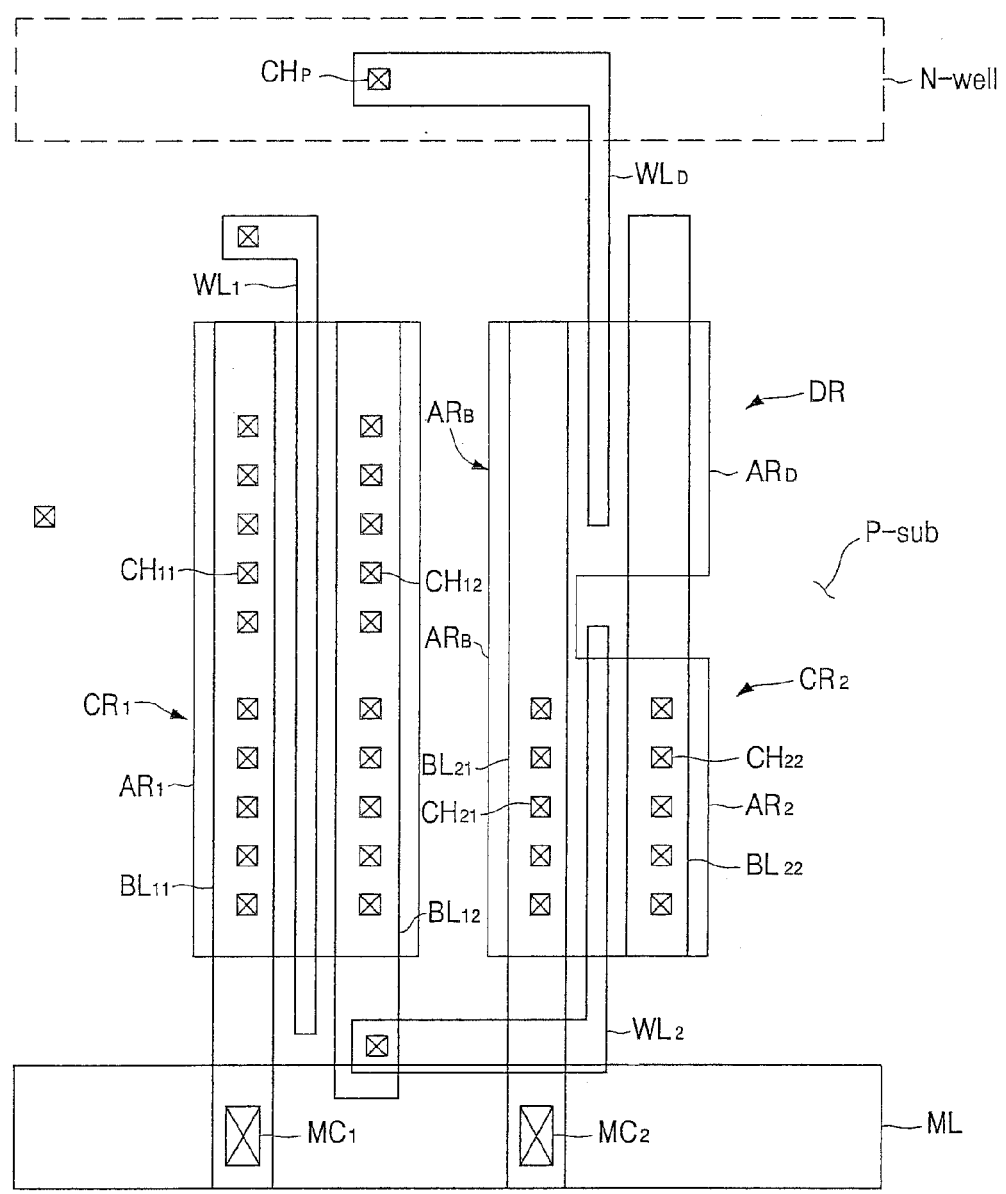

FIG. 9 is a layout of a part of a semiconductor device according to an example embodiment. The semiconductor device in this embodiment is a combination of the example embodiment described with respect to FIG. 3 where an active region may be connected with a dummy active region via an active region bridge and the example embodiment described in FIG. 7 where the dummy active region and a dummy word line implement a power capacitor using an NMOS dummy transistor. Thus, redundant descriptions are omitted.

As described above, according to example embodiments, a dummy pattern is disposed in a semiconductor device so as to improve layout uniformity and the dummy pattern may be prevented or reduced from floating, thereby preventing or reducing malfunction of the semiconductor device. In addition, noise that may occur in a power supply line of an integrated circuit may be reduced using the dummy pattern.

While example embodiments have been particularly shown and described, it will be understood by those of ordinary skill in the art that various changes in forms and details may be made therein without departing from the spirit and scope of the claims.

What is claimed is:

1. A semiconductor device comprising:
   an active region formed in a substrate;
   a dummy active region formed in the substrate and separated from the active region;
   an active region bridge connecting the active region with the dummy active region;
   a word line crossing over the active region; and
   a dummy word line, formed over the dummy active region to overlap at least part of the dummy active region, having an end positioned within the dummy active region.

2. The semiconductor device of claim 1, further comprising:
   a bit line that crosses over the active region, the dummy active region, and the active region bridge and that is electrically connected with the dummy active region and the word line.

3. The semiconductor device of claim 1, wherein
   the active region, the active region bridge, and the dummy active region are positioned in a first conductivity type region,
   the dummy active region and the dummy word line form a second conductivity type MOS transistor,
   the dummy active region is electrically connected with a bit line crossing over the dummy active region,
   the dummy word line is electrically connected with a second conductivity type region outside the first conductivity type region, and
   the dummy active region and the dummy word line form a power capacitor.

4. The semiconductor device of claim 3, wherein the first conductivity type region is an N type region and the second conductivity type region is a P type region.

5. The semiconductor device of claim 4, wherein a high voltage power supply is electrically connected to the dummy active region and a low voltage power supply is electrically connected to the dummy word line.

6. The semiconductor device of claim 3, wherein the first conductivity type region is a P type region and the second conductivity type region is an N type region.

7. The semiconductor device of claim 6, wherein a low voltage power supply is electrically connected to the dummy active region and a high voltage power supply is electrically connected to the dummy word line.

8. The semiconductor device of claim 1, wherein the end of the dummy word line is aligned with a virtual line extended from at least part of the word line.

9. The semiconductor device of claim 1, wherein the dummy active region is aligned with a virtual line extended from an end of the active region.

10. The semiconductor device of claim 1, further comprising:
    a bit line that crosses over the active region; and wherein the dummy word line is electrically connected to the bit line.

* * * * *